US009488688B2

(12) United States Patent
Despesse et al.

(10) Patent No.: US 9,488,688 B2
(45) Date of Patent: Nov. 8, 2016

(54) ELECTRIC CABLE WEAR CONTROL SYSTEM

(71) Applicant: Commissariat a L'Energie Atomique et aux Energies Alternatives, Paris (FR)

(72) Inventors: Ghislain Despesse, Saint Egreve (FR); Mikael Carmona, Tencin (FR); Jean-Michel Leger, Villard Bonnot (FR); Alexandre Paleologue, Bordeaux (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 330 days.

(21) Appl. No.: 14/302,721

(22) Filed: Jun. 12, 2014

(65) Prior Publication Data

US 2014/0368214 A1  Dec. 18, 2014

(30) Foreign Application Priority Data

Jun. 14, 2013  (FR) ...................................... 13 55523

(51) Int. Cl.
*G01R 31/08* (2006.01)
*G01R 27/26* (2006.01)
*G01R 27/02* (2006.01)
*G01R 31/02* (2006.01)
(Continued)

(52) U.S. Cl.
CPC ............. *G01R 31/083* (2013.01); *G01R 27/02* (2013.01); *G01R 27/2605* (2013.01); *G01R 31/021* (2013.01); *H01B 7/328* (2013.01); *H04B 3/46* (2013.01)

(58) Field of Classification Search
CPC .. G01R 27/02; G01R 27/2605; G01R 31/02; G01R 31/021; G01R 31/083; G01R 31/12; G01R 31/1272; G01N 27/82; G01N 27/90; G01N 27/9046; G01N 17/00; H01B 7/328; H04B 3/46; G01M 5/0033
USPC ....... 324/500, 537, 539, 541, 544, 718, 216, 324/237, 238, 240, 456
See application file for complete search history.

(56) References Cited

U.S. PATENT DOCUMENTS

| 4,684,293 A * | 8/1987 | Takafuji | D07B 1/145 324/700 |
| 7,023,217 B1 * | 4/2006 | Wong | G01R 31/021 324/424 |
| 7,123,031 B2 * | 10/2006 | Twerdochlib | G01B 7/18 324/693 |

(Continued)

FOREIGN PATENT DOCUMENTS

FR    2830941 A1    4/2003

OTHER PUBLICATIONS

Search Report issued in French Application No. 13/55523 on Jan. 28, 2014.

*Primary Examiner* — Hoai-An D Nguyen
(74) *Attorney, Agent, or Firm* — Moreno IP Law LLC

(57) ABSTRACT

A system including: a cable including: a core capable of transporting at least one useful electric signal; a sheath surrounding said core; at least one conductive wear detection strand embedded in the sheath and substantially extending along the entire length of the cable; and at least one reference conductive element which is not connected to said at least one wear detection strand and substantially extends along the entire cable length; and a control unit capable of measuring the capacitance or the resistance formed between said at least one strand and the reference conductive element.

13 Claims, 1 Drawing Sheet

(51) Int. Cl.
  *H01B 7/32* (2006.01)
  *H04B 3/46* (2015.01)

(56) References Cited

U.S. PATENT DOCUMENTS

| | | | |
|---|---|---|---|
| 7,141,990 B2 * | 11/2006 | Bast | G01N 3/066 |
| | | | 324/708 |
| 7,705,607 B2 * | 4/2010 | Mashikian | G01R 31/1272 |
| | | | 324/527 |
| 8,570,049 B2 * | 10/2013 | Bottman | G01R 31/11 |
| | | | 324/527 |
| 8,593,153 B2 * | 11/2013 | Medelius | H01B 1/04 |
| | | | 324/543 |
| 2004/0160331 A1 | 8/2004 | Chiu | |
| 2007/0126434 A1 * | 6/2007 | Twerdochlib | G01B 7/18 |
| | | | 324/693 |
| 2015/0177172 A1 * | 6/2015 | Upasani | F16L 11/086 |
| | | | 324/693 |

\* cited by examiner

ELECTRIC CABLE WEAR CONTROL SYSTEM

This application claims the priority benefit of French Patent application number 13/55523, filed on Jun. 14, 2013, the contents of which is hereby incorporated by reference in its entirety to the maximum extent allowable by law.

BACKGROUND

The present disclosure relates to a system enabling to control the wearing of an electric cable, and more particularly of a sheath surrounding the cable core.

DISCUSSION OF THE RELATED ART

In many systems, electric cables intended to transport data or power supply signals are likely to be submitted to mechanical or other types of stress, for example, friction. Along time, such stress may damage the cable, and cause a system failure or malfunction (short-circuit, cutting, etc.).

In certain critical fields, for example, in aeronautics, a failure due to the wearing of an electric cable is generally not acceptable. Cables should thus be regularly repaired or replaced, to prevent possible failures.

To ease maintenance operations, it would be desirable to have a system enabling to preventively detect a wearing of or a beginning damage to an electric cable, or even, possibly, to locate the cable area which is starting to be worn, to target as precisely as possible cable repair or replacement operations.

SUMMARY

Thus, an embodiment provides a system comprising: a cable comprising: a core capable of transporting at least one useful electric signal; a sheath surrounding the core; at least one conductive wear detection strand embedded in the sheath and substantially extending along the entire length of the cable; and at least one reference conductive element which is not connected to the wear detection strand and substantially extends along the entire cable length; and a control unit capable of measuring the capacitance or the resistance formed between the wear detection strand and the reference conductive element.

According to an embodiment, the control unit is connected to the wear detection strand and to the reference conductive element only at one of the ends of the cable.

According to an embodiment, the control unit is capable of deducing from said capacitance or resistance measurement the presence or the absence of a breakage of the wear detection strand.

According to an embodiment, the control unit is further capable of deducing from the measurement the location of the breakage with respect to the control unit.

According to an embodiment, the cable comprises a plurality of conductive wear detection strands embedded in the sheath, and the reference conductive element comprises one or a plurality of the wear detection strands.

According to an embodiment, the cable core comprises one or a plurality of conductive strands capable of transporting useful electric signals, and the reference conductive element comprises one or a plurality of the strands of the cable core.

According to an embodiment, the wear detection strand is substantially parallel to the cable core.

According to an embodiment, the wear detection strand is twisted around the cable core.

According to an embodiment, the cable comprises a plurality of wear detection strands arranged at a plurality of different depths in the sheath.

According to an embodiment, the control unit comprises a microcontroller.

According to an embodiment, the control unit is connected to the cable via connection capacitors.

Another embodiment provides a method of detecting the wearing of a cable, comprising: a core capable of transporting at least one useful electric signal; a sheath surrounding the core; at least one conductive wear detection strand embedded in the sheath and substantially extending along the entire length of the cable; and at least one reference conductive element which is not connected to the wear detection strand and substantially extends along the entire cable length, the method comprising a step of measuring the capacitance or the resistance formed between the strand and the reference conductive element.

According to an embodiment, the measurement step is implemented by a control unit connected to the wear detection strand and to the reference conductive element only at one of the ends of the cable.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the various drawings and, further, the various drawings are not to scale.

DETAILED DESCRIPTION

In the rest of the present description, unless otherwise indicated, terms "in the order of", "approximately", "substantially", and "around" mean to within ten percents.

Figure 1A:
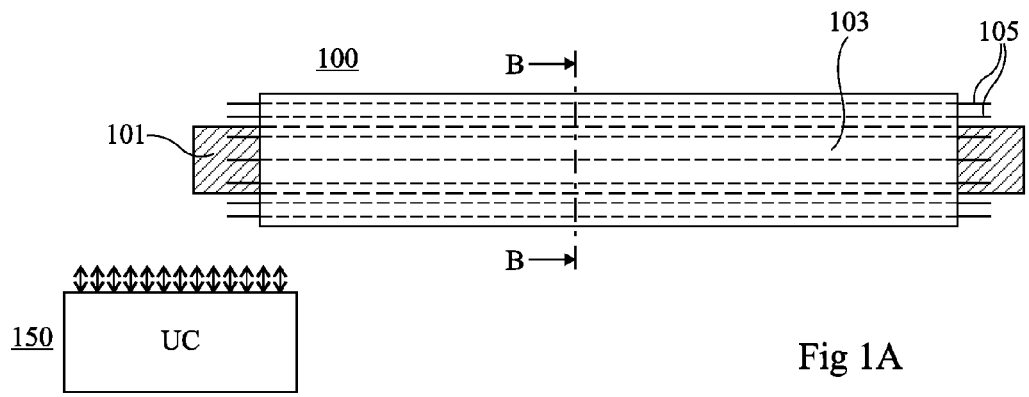
FIG. 1A schematically shows an embodiment of a system comprising an electric cable and a control unit, the system being capable of detecting the beginning of the wearing of the cable.
Figure 1B:
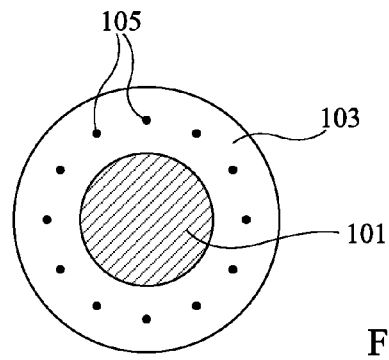
FIG. 1B is an enlarged transverse cross-section view of the electric cable of FIG. 1A.

FIG. 1A schematically shows an embodiment of a system enabling to control the wearing of an electric cable 100. This system comprises cable 100 to be monitored and, connected to cable 100, a unit 150 (UC) for controlling the wearing of cable 100. FIG. 1B is an enlarged transverse cross-section view of cable 100 (cross-section view along plane B-B of FIG. 1A).

Cable 100 comprises a core 101 intended to transport useful electric signals, for example, data signals or power supply signals. Core 101 of cable 100 may comprise a single metal strand, or a plurality of metal strands isolated from one another, enabling to transport different useful signals in parallel.

Cable 100 further comprises, around core 101, a sheath 103 made of an electrically-isolating or highly-resistive material, for example, plastic, rubber, etc.

Cable 100 further comprises, embedded in sheath 103, one or a plurality of metal strands 105, or wear detection strands. Each strand 105 extends substantially along the entire length of the cable and, in the case where a plurality of different strands 105 is provided, the different strands 105 are not in contact with one another inside of the cable. The arrangement of strands 105 and the mechanical resistance of strands 105 are selected so that strands 105 are capable of breaking when sheath 103 reaches a degree of wearing which is desired to be detected.

Control unit 150 is connected to the different wear detection strands 105 of cable 100, and is capable of checking the integrity of each strand 105. When control unit 150 detects the breakage of a strand 105, it may for example send an alert message indicating that a maintenance operation should be programmed to repair or replace the cable.

In the example of FIGS. 1A and 1B, cable 100 comprises a plurality of strands 105 (twelve strands in the shown example). In this example, each strand 105 is parallel to core 101 of the cable, and strands 105 are regularly distributed around core 101, substantially at the same distance from core 101, at an intermediate depth of sheath 103. In other words, in this example, in transverse cross-section, as appears in FIG. 1B, strands 105 are evenly distributed along a circle having its center coinciding with the center of core 101 of the cable, the radius of this circle determining the maximum degree of wearing of sheath 103 which is deemed acceptable in the considered application.

Other arrangements of strands 105 in sheath 103 may be provided. The arrangement of strands 105 is however preferably selected to enable an early detection of the wearing of the cable, whatever the cable surface submitted to the wearing.

To check the integrity of strands 105, a control unit connected to the two ends of each of strand 105 may be provided, and is configured so as to, in each strand 105, measure the strand resistance by circulating a current between the two strand ends or by applying a voltage between the two strand ends. A low resistance indicates that the strand is whole, and a high or infinite resistance indicates that the strand is broken.

However, a disadvantage of this control mode is that the control unit should be connected to the two ends of the cable, which is inconvenient, particularly when the cable is very long. Further, such a control mode does not enable, in the case where a strand breaks, to locate the breakage area.

According to an aspect of the provided embodiments, control unit 150, capable of verifying the integrity of each strand 105 of cable 100, is only connected to a single end of the cable.

Control unit 150 is connected to one end of each strand 105 of the cable, and may further, optionally, be connected to an end of one or a plurality of useful strands of core 101 of the cable.

Control unit 150 may be connected to the strands of cable 100 (wear detection strands 105 and, possibly, useful strands of core 101, either directly, or via connection capacitors (not shown). In the case of a connection between control unit 150 and a useful strand of core 101 of the cable, the provision of a connection capacitor may enable to avoid possible conflicts between the useful signals flowing in the strand, and the control signals generated by control unit 150 on this same strand. In this case, the connection capacitor may be selected to have a high impedance for useful signals flowing in the strand and a low impedance for control signals generated by control unit 150. In the case of a connection between control unit 150 and a wear detection strand 105 of the cable, the provision of a connection capacitor may enable to prevent possible damage or possible malfunctions in the case where strand 105 is incidentally placed into contact with a useful strand of core 101 of the cable, or with a conductor external to the cable, for example, a conductor of another cable.

As an example, control unit 150 may comprise a microcontroller having input/output terminals connected to strands 105 and, possibly, to one or a plurality of useful strands of core 101 of the cable, via connection capacitors or not.

According to a first embodiment, cable 100 comprises at least two different wear detection strands 105, and control unit 150 is connected to each of strands 105 but is not connected to core 101 of the cable.

In this first embodiment, it is provided, in a cable wearing verification phase, to measure by means of control unit 150, for each strand 105, the capacitance formed between strand 105 and a reference conductor formed by one or a plurality of other strands 105 set to the same potential by control unit 150.

As an example, the reference conductor may be a single strand 105 close to the strand being verified, or two strands 105 surrounding the strand being verified, or all strands 105 but the strand being verified, or also any other selection of one or a plurality of strands 105 other than the strand being verified. Control unit 150 may successively verify the integrity of each strand 105, by reconfiguring, for each verification, the selection of strand 105 to be verified and of the strand(s) 105 forming the reference conductor.

The capacitance formed between strand 105 being verified and the reference conductor is proportional to the (whole) length of the strand being verified. Knowing the linear capacitance of each strand 105 with respect to the reference conductive element associated therewith, it can be determined, for each strand 105, whether the strand has been broken and at which distance from control unit 150 the breakage has occurred. Thus, when control unit 150 detects the breakage of a strand 105, it may send an alert signal indicating not only that the strand has broken, but also at what distance from the control unit the breakage has occurred.

As an example, to measure the capacitance formed between a strand 105 and its reference conductor, an A.C. signal, for example, square, sinusoidal, or other may be applied between strand 105 and the reference conductor, and the impedance, for this signal, of the capacitive dipole formed between strand 105 and the reference conductor may be measured. This impedance is proportional to $1/\omega$, where C is the capacitance formed between strand 105 and the reference conductor, and $\omega$ is the pulse of the applied signal. Knowing the characteristics of the applied signal, the value of capacitance C can thus be deduced from the impedance measurement. As a variation, to improve the reliability of the wear detection, verifications may be performed by measuring capacitance C at a plurality of different frequencies. More generally, any other known capacitance measurement method may be used to measure capacitance C.

According to a second embodiment, cable 100 comprises one or a plurality of strands 105, and control unit 150 is connected not only to each strand 105 of the cable, but also to at least one conductive strand of core 101 of the cable, intended to transport useful signals.

In this second embodiment, it is provided, in a cable wearing verification phase, to measure by means of control unit 150, for each strand 105, the capacitance formed between strand 105 and a reference conductor formed by one or a plurality of useful strands 101 of the cable.

The capacitance formed between strand 105 being verified and the reference conductor is proportional to the (whole) length of the strand being verified. Knowing the linear capacitance of each strand 105 with respect to the reference conductor, it can be determined, for each strand 105, whether the strand has been broken and at what distance from control unit 150 the breakage has occurred.

The capacitance may be measured similarly or identically to what has been described in the first embodiment. In the case where the measurement comprises applying an A.C. signal between strand 105 being verified and the reference conductor, the frequency of this signal is preferably selected to be relatively high with respect to the frequency of the useful signals capable of being transported by the reference conductor, to avoid disturbing these useful signals. As an example, if the frequency of the useful signals capable of being transported in the cable core does not exceed 1 kHz, it may be provided to perform the capacitance measurement at a frequency greater than or equal to 100 kHz, for example, in the order of 1 MHz.

According to a third embodiment, sheath 103 of cable 100 is not totally isolating but is made of a resistive material capable of circulating a certain amount of current, for example, rubber having leakages such as porous rubber. In this third embodiment, cable 100 comprises at least two different wear detection strands 105, and control unit 150 is connected to each of strands 105 but is not connected to core 101 of the cable.

In this third embodiment, it is provided, in a cable wear verification phase, to measure by means of control unit 150, for each strand 105, the resistance between strand 105 and a reference conductor formed by one or a plurality of other strands 105 set to the same potential by control unit 150.

As an example, the reference conductor may be a strand 105 close to the strand being verified, or two strands 105 surrounding the strand being verified, or all strands 105 but the strand being verified, or also any other selection of one or a plurality of strands 105 other than the strand being verified.

The resistance formed between strand 105 being verified and the reference conductor is inversely proportional to the (whole) length of the strand being verified. Knowing the linear resistance of the resistive dipole formed between each strand 105 with respect to the reference conductive element associated therewith, it can be determined, for each strand 105, whether the strand has been broken and at what distance from control unit 150 the breakage has occurred.

According to a fourth embodiment, cable 100 comprises one or a plurality of strands 105, and control unit 150 is connected not only to each strand 105 of the cable, but also to at least one conductive strand of core 101 of the cable, intended to transport useful signals.

In this fourth embodiment, it is provided, in a cable wear verification phase, to measure by means of control unit 150, for each strand 105, the resistance formed between strand 105 and a reference conductor formed by one or a plurality of useful strands 101 of the cable.

The resistance formed between strand 105 being verified and the reference conductor is inversely proportional to the (whole) length of the strand being verified. Knowing the linear resistance of the resistive dipole formed between strand 105 and the reference conductive element, it can be determined whether the strand has been broken and at what distance from control unit 150 the breakage has occurred.

It should be noted that the material of sheath 103 may be both dielectric and resistive. In this case, resistance and capacitance measurements may be performed and crossed to improve the accuracy of the cable wear control. More generally, to improve the accuracy of the cable wear control, the first, second, third, and/or fourth above-mentioned embodiments may be totally or partly combined.

During integrity controls on strands 105 of cable 100, the resistance or capacitance measurement signals generated by control unit 150 are preferably selected to avoid disturbing the surrounding equipment and respect electromagnetic compatibility rules. If necessary, according to the sensitivity of the environment to electromagnetic disturbances, the measurements may be performed by means of low-amplitude wide band signals.

It should be noted that the provided embodiments are not limited to the example of FIGS. 1A and 1B, where the wear detection strands 105 provided in sheath 103 are parallel to core 101 of the cable. Many other shapes and/or arrangements of the wear detection strands may be provided. As an example, the wear detection strands may have a zigzag or crenellated shape, and each strand may be arranged either in a radial plane of the cable or in another plane. In this case, wear detection strands have a total (developed) length greater than the cable length and thus form, with the corresponding reference conductive elements, capacitances (respectively resistances) greater (respectively smaller) than those of the example of FIGS. 1A and 1B. Stand breakage detections in capacitive mode (first and second embodiments) and in resistive mode (third and fourth embodiments) are thereby eased.

Figure 2:
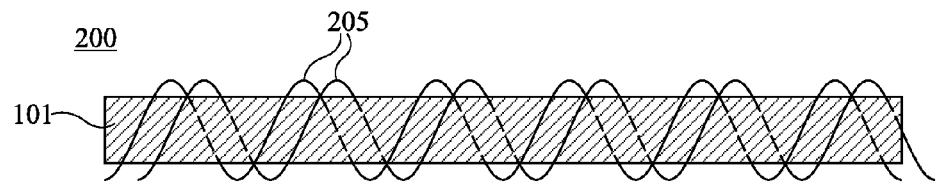
FIG. 2 is a partial side view of an electric cable, schematically illustrating an alternative embodiment of the system of FIGS. 1A and 1B.

FIG. 2 is a partial side view of an electric cable 200, schematically illustrating another example of arrangement of the wear detections strands compatible with the above-described embodiments.

Cable 200 comprises, as in the example of FIGS. 1A and 1B, a core 101 intended to transport useful electric signals, and a sheath 103 (not shown in FIG. 2 for more clarity) surrounding core 101. Cable 200 further comprises, embedded in sheath 103, one or a plurality of wear detection metal strands 205.

In the example of FIG. 2, strands 205 are twisted, each strand 205 forming a winding around core 101 of the cable, this winding substantially extending along the entire length of the cable. In the shown example, two different substantially parallel strands 205 have been shown. However, cable 200 may comprise a single twisted strand 205 or a number of twisted strands 205 greater than two. In the case where a plurality of strands 205 are provided, strands 205 are arranged so that two different strands 205 are not in contact inside of the cable.

In the shown example, strands 205 are all twisted along the same winding direction around core 101 of the cable. The described embodiments are however not limited to this specific case, and different wear detection strands 205 may be wound around core 101 of the cable along opposite winding directions. In this case, the strands wound along different directions may be arranged at different depths of the sheath, to avoid for these strands to be placed in contact inside of the cable.

An advantage of the alternative embodiment of FIG. 2 is that, for a given cable length, the length of wear detections strands 205 is greater than the length of wear detections strands 105 in the example of FIGS. 1A and 1B. This eases the detection of capacitance or resistance variations between each wear detection strand and the reference conductor associated therewith, and thus increases the reliability of the wear detection system.

Another advantage of the alternative embodiment of FIG. 2 is that the twisted arrangement of wear detection strands 205 reinforces the mechanical behavior of the cable with respect to the example of FIGS. 1A and 1B, by easing the cable bending.

Figure 3:
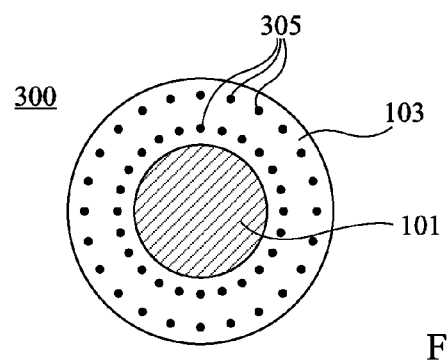
FIG. 3 is a transverse cross-section view of an electric cable, schematically illustrating another alternative embodiment of the system of FIGS. 1A and 1B.

FIG. 3 is a transverse cross-section view of an electric cable 300, schematically illustrating another example of arrangement of wear detection strands compatible with the embodiments described in relation with FIGS. 1A and 1B.

Cable 300 comprises, as in the example of FIGS. 1A and 1B, a core 101 intended to transport useful electric signals, and a sheath 103 surrounding core 101. Cable 300 further comprises, embedded in sheath 103, a plurality of metal wear detection strands 305.

In the example of FIG. 3, as in the examples of FIGS. 1A and 1B, each strand 305 is substantially parallel to core 101 of the cable, substantially extends along the entire length of the cable, and is in contact with no other strand 305 inside of the cable. Cable 300 differs from cable 100 of FIGS. 1A and 1B in that, in cable 300, wear detection strands 305 are not all at the same distance from core 101 of the cable, but are placed at at least two different depths in sheath 103. In the shown example, strands 305 are, in transverse cross-section, distributed in sheath 103 on two circles having different radiuses with their centers coinciding with the center of core 101.

An advantage of the alternative embodiment of FIG. 3 is that it enables to detect and to differentiate two different wear stages, which provides a greater flexibility for the management of cable maintenance operations.

More generally, whatever the shape (twisted, zigzag rectilinear, or other) of the wear detections strands arranged in sheath 103 of the cable, the wear detection strands may be arranged at a plurality of different depths in the sheath (two or more), to enable to differentiate different degrees of wearing.

Specific embodiments have been described. Various alterations, modifications, and improvements will readily occur to those skilled in the art.

In particular, although this has not been shown in the drawings, the above-described embodiments are also compatible with coaxial-type cables, that is, comprising:
a core comprising one or a plurality of useful conductive strands surrounded with a first isolating or resistive sheath; and
a conductive layer surrounding the first sheath, the conductive layer being itself surrounded with a second isolating or resistive sheath.

In this case, the wear detection strands are preferably placed in the second sheath (outer sheath), to be able to detect the wearing of the cable before the intermediate conductive layer is touched. However, as a variation, if the intermediate conductive layer has no critical electric function, for example, if it only has a function of mechanical hold of the cable, the wear detections strands may be placed in the first sheath (inner sheath).

It should be noted that in the case of a coaxial cable, the reference conductive element may be the intermediate conductive layer of the cable.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A system comprising:
a cable (100; 200; 300) comprising: a core (101) capable of transporting at least one useful electric signal; a sheath (103) surrounding said core; at least one conductive wear detection strand (105; 205; 305) embedded in the sheath and substantially extending along the entire length of the cable; and at least one reference conductive element which is not connected to said at least one wear detection strand and substantially extends along the entire cable length; and
a control unit (150) capable of measuring the capacitance or the resistance formed between the wear detection strand (105; 205; 305) and the reference conductive element.

2. The system of claim 1, wherein the control unit (150) is connected to said at least one wear detection strand (105; 205; 305) and to said at least one reference conductive element only at one of the ends of the cable (100; 200; 300).

3. The system of claim 1, wherein the control unit (150) is capable of deducing from said capacitance or resistance measurement the presence or the absence of a breakage of said at least one wear detection strand (105; 205; 305).

4. The system of claim 3, wherein the control unit (150) is further capable of deducing from said measurement the location of said breakage with respect to the control unit (150).

5. The system of claim 1, wherein the cable (100; 200; 300) comprises a plurality of conductive wear detection strands (105; 205; 305) embedded in the sheath (103), and wherein said reference conductive element comprises one or a plurality of said wear detection strands.

6. The system of claim 1, wherein the core (101) of the cable (100; 200; 300) comprises one or a plurality of conductive strands capable of transporting useful electric signals, and wherein said reference conductive element comprises one or a plurality of said strands of the core (101) of the cable.

7. The system of claim 1, wherein said at least one wear detections strand (105; 305) is substantially parallel to the core (101) of the cable (100; 300).

8. The system of claim 1, wherein said at least one wear detections strand (205) is twisted around the core (101) of the cable (200).

9. The system of claim 1, wherein the cable (300) comprises a plurality of wear detection strands (305) arranged at a plurality of different depths in the sheath (103).

10. The system of claim 1, wherein the control unit (150) comprises a microcontroller.

11. The system of claim 1, wherein the control unit (150) is connected to the cable (100; 200; 300) via connection capacitors.

12. A method of detecting the wearing of a cable (100; 200; 300) comprising: a core (101) capable of transporting at least one useful electric signal; a sheath (103) surrounding said core; at least one conductive wear detection strand (105; 205; 305) embedded in the sheath and substantially extending along the entire length of the cable; and at least one reference conductive element which is not connected to said at least one wear detection strand and substantially extends along the entire cable length, the method comprising a step of measuring the capacitance or the resistance formed between said at least one strand (105; 205; 305) and said at least one reference conductive element.

13. The method of claim 12, wherein said measurement step is implemented by a control unit (150) connected to said at least one wear detection strand (105; 205; 305) and to said at least one reference conductive element only at one of the ends of the cable (100; 200; 300).

* * * * *